(12) United States Patent
Cooray et al.

(10) Patent No.: US 6,916,539 B2
(45) Date of Patent: *Jul. 12, 2005

(54) HALOGEN-FREE, FLAME-RETARDANT INSULATING EPOXY RESIN COMPOSITION AND CIRCUIT BOARD COMPRISING INSULATION LAYER FORMED THEREOF

(75) Inventors: Nawalage Florence Cooray, Kawasaki (JP); Koji Tsukamoto, Kawasaki (JP); Takeshi Ishitsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/214,640

(22) Filed: Aug. 9, 2002

(65) Prior Publication Data

US 2003/0211328 A1 Nov. 13, 2003

Related U.S. Application Data

(62) Division of application No. 09/730,606, filed on Dec. 7, 2000, now Pat. No. 6,486,235.

(30) Foreign Application Priority Data

Dec. 8, 1999 (JP) ............................................ 11-349042

(51) Int. Cl.$^7$ ......................... B32B 27/38; C09K 21/12; C08L 63/00
(52) U.S. Cl. ....................... 428/414; 428/413; 428/901; 252/609; 523/451; 523/457; 525/481
(58) Field of Search ................................ 252/601, 609; 428/413, 414, 901; 523/400, 435, 451, 457; 525/481

(56) References Cited

U.S. PATENT DOCUMENTS

| 5,354,939 | A | | 10/1994 | Hollstein et al. ........... 523/206 |
|---|---|---|---|---|
| 5,641,840 | A | | 6/1997 | Tsuchida et al. ............ 525/481 |
| 5,955,184 | A | * | 9/1999 | Honda et al. ............ 428/299.4 |
| 6,180,695 | B1 | | 1/2001 | Ito et al. ...................... 523/451 |
| 6,486,235 | B2 | * | 11/2002 | Cooray et al. .............. 523/451 |

FOREIGN PATENT DOCUMENTS

| JP | 10-182792 A2 | 7/1998 |
|---|---|---|
| JP | 11-189639 A2 | 7/1999 |
| JP | 11-189704 A2 | 7/1999 |

OTHER PUBLICATIONS

Machine translation of JP 10–182792, provided by the JPO web site.*

Machine translation of JP 11–189639, provided by the JPO web site.*

Machine translation of JP 11–189704, provided by the JPO web site.*

* cited by examiner

*Primary Examiner*—Robert Dawson
*Assistant Examiner*—Michael J Feely
(74) *Attorney, Agent, or Firm*—Westerman, Hattori, Daniels & Adrian, LLP

(57) ABSTRACT

A halogen-free, flame-retardant insulating epoxy resin composition which comprises (1) an epoxy resin, (2) a curing agent for the epoxy resin, (3) a phosphate of a resorcinol type, (4) aluminum hydroxide, and (5) a cure accelerator for the epoxy resin. The composition displays necessary flame retardant properties and sufficient insulating properties after the formation of an insulating layer in a circuit board, withstands a plating process, and does not cause the bleedout of the insulation layer formed. A circuit board with flame retardant properties comprising insulation layers formed of the epoxy resin composition is also disclosed.

29 Claims, 1 Drawing Sheet

HALOGEN-FREE, FLAME-RETARDANT INSULATING EPOXY RESIN COMPOSITION AND CIRCUIT BOARD COMPRISING INSULATION LAYER FORMED THEREOF

CROSS-REFERENCE TO RELATED APPLICATIONS

This application is a divisional of U.S. Ser. No. 09/730,606, filed Dec. 7, 2000, now U.S. Pat. No. 6,486,235, which claims priority to Japanese Patent Application No. 11-349042, filed Dec. 8, 1999.

BACKGROUND OF THE INVENTION

1. Field of the Invention

The invention relates to a halogen-free, flame-retardant insulating epoxy resin composition. In particular, the invention relates to a halogen-free, flame-retardant insulating epoxy resin composition used during the formation of wiring layers on a substrate formed mainly of an organic material, in the field of multi-layer circuit boards, such as MCM-L/D (multi-chip module-laminate/deposit) circuit boards or single-chip package circuit boards, and a multi-layer circuit board comprising insulation layers formed by the use of the epoxy resin composition.

2. Description of the Related Art

A printed circuit board has been commonly used to compactly incorporate electronic parts in electronic equipment. Such a printed circuit board, which is produced by etching a copper foil provided on a surface of a laminated sheet (a core substrate) following given electronic circuit patterns, and is used by mounting thereon various electric or electronic parts, is difficult to densely load with electronic parts, but has the advantage of low cost. For a hybrid IC, on the other hand, a build-up multi-layer wiring structure has been used for a long time. In this case, a multi-layer circuit board is fabricated by successively printing alternate thick paste films of a conductor and an insulator on a ceramic substrate to form a laminate, and then firing it.

Recently, due to a demand for miniaturization, enhanced performance, and reduced cost of electronic equipment, the miniaturization of and the use of multi-layer structure in electronic circuits, and the dense mounting of electronic parts have proceeded rapidly, and the use of build-up multi-layer wiring structure in printed circuit boards has been considered in the area of printed circuit boards. An insulation layer for a build-up structure is formed over an underlying wiring layer except for locations (portions of piercing hole, generally called "via hole") at which the electronic circuits on and under the insulation layer are connected with each other.

To form the insulation layer for a build-up structure, an epoxy resin is mainly used because of its excellent electrical properties, workability, and cost.

In general, an epoxy resin has the shortcoming of being relatively flammable. This is not desirable for a material used in electronic equipment which must be difficult to burn. Accordingly, to make an epoxy resin flame retardant, it is most common to use a halogenated epoxy (particularly an epoxy containing bromine) and antimony oxide as a flame retardant in combination.

However, since a halogenated organic material, such as a halogenated epoxy, will generate a harmful substance having high toxicity during combustion, and antimony oxide is a carcinogenic substance, the epoxy resin composition using these in combination poses environmental and safety problems. Accordingly, the trend to discontinue use of products using such a flame-retardant epoxy resin composition has intensified, mainly in Europe. As a result, a halogen-free and antimony-free insulating resin which does not use both halogen-based and antimony-based flame retardants is required, and development of such a material is strongly demanded.

It is known to use a metal hydrate, particularly aluminum hydroxide or magnesium hydroxide, in an epoxy resin composition, in lieu of a halogen-based flame retardant. To develop practical flame retardant properties, however, it is required to add a metal hydroxide to an epoxy resin composition in a large amount, with the result that the composition has poor curing, insulating, and mechanical properties, and problems occur in the formation of build-up layers.

It is also known, in the field of flame retardants, to use phosphorus or an organic phosphorus compound as a phosphorus-based flame retardant. Phosphorus-based flame retardants are classified into an addition type and a reaction type. Representative of the phosphorus flame retardant of the addition type is phosphorus (red phosphorus) or a phosphate. However, in the case of the addition of phosphorus, there is a difficulty of degraded insulating properties of the epoxy resin composition as in the case of the metal hydrate. In the case of the use of a common phosphate, a phenomena of the phosphorus compound appearing at the surface of an insulation layer at an elevated temperature, which is called "bleedout", poses a problem, and a phosphate has a shortcoming of being affected by a plating process.

SUMMARY OF THE INVENTION

Thus, it is an object of the invention to provided a novel halogen-free epoxy resin composition which can display necessary flame retardant properties and sufficient insulating properties after the formation of an insulating layer in a circuit board, withstands a plating process, and does not cause the bleedout in the insulation layer formed of the composition.

It is also an object of the invention to provide a circuit board with flame retardant properties comprising insulation layers formed of the epoxy resin composition.

According to the invention, there is provided a halogen-free, flame-retardant insulating epoxy resin composition which comprises (1) an epoxy resin, (2) a curing agent for the epoxy resin, (3) a phosphate of a resorcinol type, (4) aluminum hydroxide, and (5) a cure accelerator for the epoxy resin.

According to the invention, there is also provided a circuit board which has a multi-layer structure comprising a core substrate and one or more sets of alternate insulation layer and wiring layer on the core substrate, and wherein at least one of the insulation layers is formed of the halogen-free, flame-retardant insulating epoxy resin composition of the invention.

BRIEF DESCRIPTION OF THE DRAWING

The above and other objects and advantages of the invention will be well understood and appreciated, by a person with ordinary skill in the art, from consideration of the following detailed description made by referring to the attached drawing, wherein.

DETAILED DESCRIPTION OF THE INVENTION

Figure 1:
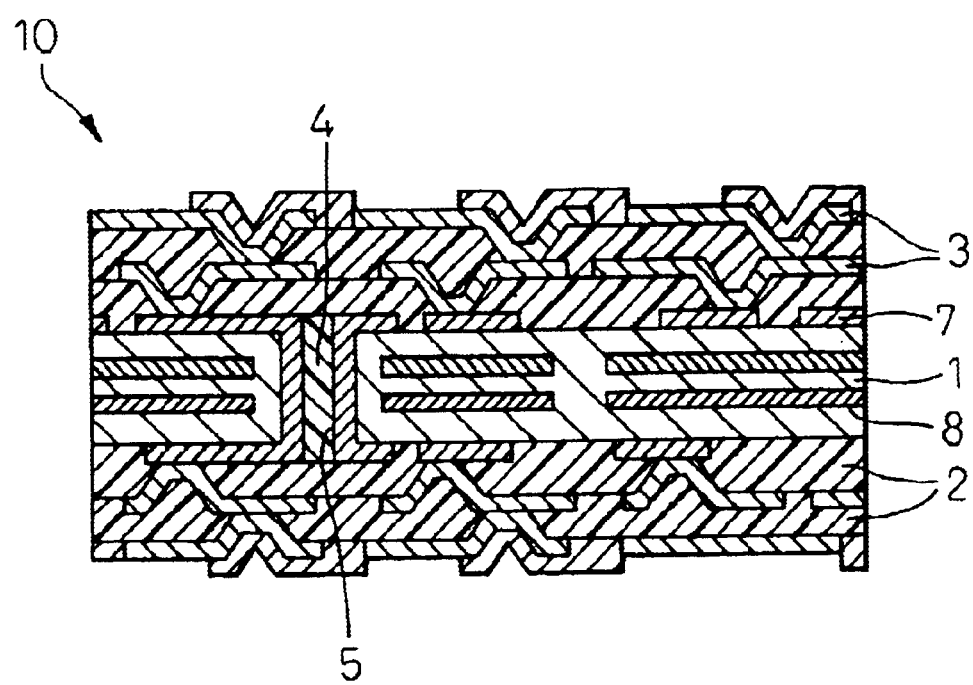
FIG. 1 is an illustration of the circuit board of the invention.

The flame-retardant insulating epoxy resin composition of the invention is constituted by adding, to an epoxy composition consisting essentially of an epoxy resin, a curing agent, and a cure accelerator, a phosphate of a resorcinol type as a flame retardant component, and aluminum hydroxide as another flame retardant component, the phosphate being an organic phosphorus compound of an addition type, which contains no halogen causing the generation of a harmful compound for disposal, is thermally stable, and develops no bleedout.

The epoxy resin in the epoxy resin composition of the invention has two or more epoxy groups in its molecule, and can be cured to provide a solid film. The epoxy resin is selected so that a cured product has sufficient properties for an insulation layer in a circuit board, such as a peel strength, a tensile elongation, and resistance in a plating step. A preferred epoxy resin in the composition of the invention is an alicyclic or aromatic epoxy resin. The epoxy resin in the composition of the invention has two or more functionalities, and more preferably two to four functionalities. Preferred difunctional aromatic epoxy resins can be exemplified by difunctional epoxy resins such as bisphenol A epoxies, bisphenol B epoxies, and bisphenol F epoxies. Trifunctional aromatic epoxy resins can be exemplified by triglycidyl isocyanurate epoxy, VG3101L manufactured by Mitsui Chemical and the like, and tetrafunctional aromatic epoxy resins can be exemplified by Araldite MTO163 manufactured by Ciba Geigy and the like. Preferred alicyclic epoxy resins can be exemplified by difunctional epoxies such as Araldite CY179 (Ciba Geigy) and EHPE-3150 (Daicel Chemical), trifunctional epoxies such as Epolite GT300 (Daicel Chemical), and tetrafunctional epoxies such as Epolite GT400 (Daicel Chemical). An insulation film formed of the epoxy resin composition of the invention, which particularly includes an epoxy resin having a low molecular weight formed of the trifunctional or tetrafunctional epoxy, can have a reinforced, intermolecular network structure to thereby restrain the dissolution of a phosphate flame retardant used in the epoxy resin composition of the invention, and, accordingly, makes it possible to provide a flame-retardant insulation layer which possesses very good resistance to a plating solution and is also superior in other mechanical properties.

Two or more epoxy resins can be used in combination so as to be capable of providing sufficient properties for an insulation layer. It is preferred to use a mixture of an alicyclic epoxy and an aromatic epoxy. In this case, it is particularly favorable to use an epoxy mixture containing at least one epoxy resin having three or more functionalities, to thereby form an insulation layer having an increased peel strength, an increased tensile elongation, and a high glass transition temperature (Tg). Preferably, the epoxy resin composition of the invention comprises at least a trifunctional epoxy resin, in addition to at least a difunctional alicyclic epoxy and a difunctional aromatic epoxy.

The curing agent in the epoxy resin composition of the invention may be any compound, which is useful to cure the epoxy compound or compounds used, although it should be selected so as not to damage properties of a formed insulation layer. In the invention, a phenolic resin of an aralkyl type (for example, XLC-LL available from Mitsui Chemical), a phenolic novolak resin (for example, PSM-4300 available from Gun-ei Kagaku) or the like can be used. A mixture of curing agents may also be used, depending on properties required in an insulation layer. A combination of the phenolic resin of an aralkyl type and the phenolic novolak resin referred to above is a preferred curing agent in the epoxy resin composition of the invention.

Although the amount of curing agent used may be discretionally determined taking the properties and the like of an insulation layer to be formed into consideration, it is usually preferred that a curing agent is used in an amount providing an active hydrogen equivalent of 0.8 to 1.1 per equivalent of epoxy group in the composition.

As the cure accelerator in the composition of the invention, any appropriate compound may be used, depending on types of epoxy compound and curing agent used. As examples of preferred cure accelerators, reference can be made to imidazole compounds, triphenylphosphine, tertiary amines and the like. Two or more types of cure accelerators may be used in the composition of the invention.

Although the amount of cure accelerator used may also be discretionally determined, depending on types of epoxy compound and curing agent, a cure accelerator is typically used in an amount of 1 to 10 parts by weight per 100 parts by weight of epoxy resin in the composition.

In the composition of the invention, particularly a phosphate of a resorcinol type is used as a component imparting flame retardant properties to the composition. Conventional phosphate flame retardants are prone to dissolve in a plating solution to thereby make an insulation layer fragile and, in addition, to bleed out at an elevated temperature, whereas the phosphate of a resorcinol type is free from such a defect, and can be used as a flame retardant of an addition type. A representative of phosphate of a resorcinol type which can be used in the invention is FP-500 manufactured by Asahi Denka. In the invention, the phosphate of a resorcinol type is preferably used in an amount of 12 to 18 parts by weight per 100 parts by weight of total solids in the epoxy resin composition of the invention.

The phosphate in an amount of less than 12 parts by weight does not yield sufficient flame retarding properties, and in an amount of more than 18 parts by weight does not yield a sufficient plating peel strength.

In the composition of the invention, aluminum hydroxide is used as another flame retardant component. Taking the thickness of an insulation layer to be formed into consideration, aluminum hydroxide having a suitable diameter is selected. In the invention, since aluminum hydroxide is used in combination with the phosphate of a resorcinol type, the amount of flame-retarding aluminum hydroxide used can be suppressed to a lower level and, accordingly, it is possible to suppress unfavorable effects on the insulating properties and mechanical properties of a formed insulation layer without damaging the curing characteristics of an insulating epoxy resin composition. In general, it is preferred that aluminum hydroxide is used in an amount of 15 to 20 parts by weight per 100 parts by weight of total solids in the epoxy resin composition of the invention. Aluminum hydroxide in an amount of less than 15 parts by weight does not yield sufficient flame retarding properties, and that in an amount of more than 20 parts by weight lowers the mechanical properties of the cured resin.

Thus, by the use of a combination of a phosphate of a resorcinol type and aluminum hydroxide in combination, without using a halogen-containing compound, the composition of the invention can display flame retarding properties and sufficient insulating properties which are required in a circuit board, and also can provide an insulation layer free of bleedout and withstanding a plating process.

The composition of the invention may contain any of various additives, as required. Examples of such additives include a filler, a leveling agent and so forth. Addition of silica powder as an inorganic filler significantly improves thixotropic properties, and is very favorable. The amount of silica powder should be determined so as not to damage other properties of an insulation layer to be formed. Specifically, it is preferred that silica powder is added to the composition of the invention in an amount of 2.5 to 5.0 parts by weight per 100 parts by weight of total solids in the composition.

In general, the composition of the invention is applied to a substrate to be processed (a core substrate, or a core substrate on which an insulation layer or layers and a wiring layer or layers have been formed), as varnish. The composition of the invention can contain an appropriate solvent to prepare a vanish composition. As examples of solvents which can be used in the composition of the invention, reference can be made to organic solvents including acetates such as propylene glycol monoether acetate, cyclohexane, dioxanes, methyl ethyl ketone (MEK), xylenes, N-methylpyrrolidone and so forth.

To produce a circuit board by the use of the composition of the invention, the composition is first applied onto a substrate for electronic circuit board by an appropriate method, such as screen printing, curtain coating, roll coating, or spin coating, to form a film having a desired thickness (for example, 40 micrometers). The film is then heated for drying at an appropriate temperature (for example, 120° C.). Subsequently, the dried film is heated at, for example, 170 to 200° C., to thermally cure a thermoset epoxy resin component in the film to form an insulation layer. Via holes are then formed in the insulation layer by a laser beam machine using, for example, a carbon dioxide laser, an excimer laser, or a YAG laser, at the locations at which an electronic circuit existing under the insulation layer and an electric circuit to be subsequently formed on the insulation layer are to be connected with each other. The substrate is then immersed in an aqueous alkaline solution, such as an aqueous solution of permanganic acid, to be roughened at its surface, after which the substrate is subjected to electroless plating followed by electroplating to form a conductor layer thereon. The formed conductor layer is then patterned to form an upper wiring layer. Usually, an insulation layer and a wiring layer are formed on either side of the substrate in this sequence of steps. Subsequently, the steps of from the application of the composition to the formation of the upper wiring layer can be repeated at a certain number of times, to thereby produce a multi-layer circuit board. Such a production of a multi-layer circuit board by a build-up process is well known, and is not necessary further describe it herein.

As illustrated in FIG. 1, a circuit board 10 of the invention comprises a core substrate 1, which is provided on its both sides with patterned wiring layers 7, as lower layers, and insulation layers 2 and wiring layers 3 formed on both sides of the substrate by carrying out the sequence of steps from the application of the epoxy resin composition of the invention to the formation of the upper wiring layer at predetermined times as described above. In the case where the circuit board 10 has the insulation layers 2 and the wiring layers 3 formed on each side of the substrate by the repetion of the sequence of steps described above at a plural times, as shown in the drawing, some of the insulation layers 2 may be formed of a material other than the epoxy resin composition of the invention. The substrate (core substrate) 1 as shown in FIG. 1 usually comprises through holes 5, which are formed to have an inside wall of a conductor material in order to interconnect the wiring layers 7 on both sides of the substrate 1, and are filled with an insulating resin material 4, and wirings 8 formed inside the substrate 1. The circuit board 10 can also comprise a protective layer (not shown) on each of the uppermost wiring layers on both sides, terminals (not shown) to be used to mount various electric or electronic parts thereon, and so forth.

EXAMPLES

The invention will be further described by means of examples. Of course, these examples only illustrate the invention, and are not intended to limit the invention.

Example 1

A coating composition was prepared by dissolving or dispersing 75 parts by weight of bisphenol A epoxy resin (XAC5020 available from Ciba Geigy), 25 parts by weight of alicyclic epoxy resin having a cyclohexane skeleton (Araldite CY179 available from Ciba Geigy), 10 parts by weight of triglycidyl isocyanurate epoxy resin (Nissan Kagaku), 35 parts by weight of phosphate of a resorcinol type (FP-500 manufactured by Asahi Denka), 60 parts by weight of phenolic resin of an aralkyl type (XLC-LL available from Mitsui Chemical), 30 parts by weight of phenolic novolak resin (PSM-4300 available from Gun-ei Kagaku), 1.0 part by weight of 2-methyl-4-ethylimidazole (Shikoku Kasei), 40 parts by weight of aluminum hydroxide (Sumitomo Kagaku, particle diameter 1 micrometer or smaller), and 7.5 parts by weight of silica powder (Asahi Denka Kogyo, particle diameter 1 micrometer or smaller), in a mixed solvent of 24 parts by weight of propylene glycol monoether acetate, 16 parts by weight of MEK, and 20 parts by weight of N-methylpyrrolidone.

The prepared composition was applied to a copper foil substrate to form a film having a thickness of 70 micrometers. The coated film was dried at 120° C. for 20 minutes, and was then heated at 170° C. for 60 minutes, after which the film was allowed to cool to room temperature to form a cured resin film. Subsequently, the substrate having the cured resin film thereon was successively immersed in a pretreatment agent solution (the Conditioner manufactured by Shipley, 70° C., 10 minutes), an oxidizing agent solution (the Promoter manufactured by Shipley, 70° C., 10 minutes, pH=11), and a neutralizer solution (the Neutralizer manufactured by Shipley, 60° C., 10 minutes), and then electrolessly plated and electroplated with copper successively to form a conductor layer having a thickness of 25 micrometers on the resin film. The conductor layer had a peel strength of 950 gf/cm (9.3 N/cm).

The coating composition was also applied to an aluminum sheet, and was peeled after the curing to obtain a film having a thickness of 70 micrometers. The test of the film using a tensile tester revealed an elongation at break of 5.5% or more.

The coating composition was also applied to either side of a halogen-free core substrate (a copper-etched core substrate manufactured by Toshiba, 125 mm×13 mm×0.4 mm) to form a film having a thickness of 70 micrometers, and the film was dried at 100° C. for 20 minutes, was then heated at 170° C. for 60 minutes, and was allowed to cool to room temperature. Subsequently, the substrate was subjected to a UL94V flame-retardant test, and showed flame-retardant properties equivalent to Class V1.

The coating composition was also applied to a BT (bismaleimide triazine) substrate having patterned wirings at a distance of 126 micrometers, and dried and heated to form an insulation layer as described above. The substrate was then subjected to a USPCBT (unsaturated pressure cooker bias test) (galvanic corrosion test) at the conditions of 120° C., 85% relative humidity, 1.7 atm (172kPa), 24 volts, and 100 hours. During the test, the resistance between the adjacent wirings was maintained at the order of $1\times10^7$ ohms. After the test, the wirings were dried, and tested to show a resistance between the adjacent wirings of the order of $1\times10^{12}$ ohms. These results indicated that the formed insulation layer had good insulation properties.

The results obtained through the tests in this example are summarized in Table 1.

Example 2

A coating composition was prepared by dissolving or dispersing 75 parts by weight of bisphenol A epoxy resin (XAC5020 available from Ciba Geigy), 25 parts by weight of alicyclic epoxy resin having a cyclohexane skeleton (Araldite CY179 available from Ciba Geigy), 20 parts by weight of trifunctional epoxy resin (VG3101L available from Mitsui Chemical), 35 parts by weight of phosphate of a resorcinol type (FP-500 manufactured by Asahi Denka), 60 parts by weight of phenolic resin of an aralkyl type (XLC-LL available from Mitsui Chemical), 30 parts by weight of phenolic novolak resin (PSM-4300 available from Gun-ei Kagaku), 1.0 part by weight of 2-methyl-4-ethylimidazole (Shikoku Kasei), 40 parts by weight of aluminum hydroxide (Sumitomo Kagaku, particle diameter 1 micrometer or smaller), and 7.5 parts by weight of silica powder (Asahi Denka Kogyo, particle diameter 1 micrometer or smaller), in a mixed solvent of 24 parts by weight of propylene glycol monoether acetate and 16 parts by weight of MEK.

The prepared composition was applied to a copper foil substrate to form a film having a thickness of 70 micrometers. The coated film was dried at 120° C. for 20 minutes, and was then heated at 170° C. for 60 minutes, after which the film was allowed to cool to room temperature to form a cured resin film. Subsequently, the substrate was treated as in Example 1, and then electrolessly plated and electroplated with copper successively to form a copper film having a thickness of 25 micrometers on the resin film. The copper film had a peel strength of 1100 gf/cm (10.8 N/cm).

An insulation layer formed on an aluminum sheet as in Example 1 using the above coating composition had a tensile elongation of 7.2%.

Also, a UL94V flame-retardant test as in Example 1 revealed that an insulation layer formed of the above coating composition on a halogen-free core substrate had flame-retardant properties equivalent to Class V1.

A USPCBT test performed as in Example 1 using the above composition also showed that the resistance between the adjacent wirings was maintained at the order of $1\times10^7$ ohms during the test. The resistance between adjacent wirings dried after the test was on the order of $1\times10^{12}$ ohms.

The results obtained through the tests in this example are also summarized in Table 1.

Example 3

A coating composition was prepared by dissolving or dispersing 75 parts by weight of bisphenol A epoxy resin (XAC5020 available from Ciba Geigy), 25 parts by weight of alicyclic epoxy resin having a cyclohexane skeleton (Araldite CY179 available from Ciba Geigy), 30 parts by weight of tetrafunctional epoxy resin (Araldite MT0163 available from Ciba Geigy), 35 parts by weight of phosphate of a resorcinol type (FP-500 manufactured by Asahi Denka), 60 parts by weight of phenolic resin of an aralkyl type (XLC-LL available from Mitsui Chemical), 30 parts by weight of phenolic novolak resin (PSM-4300 available from Gun-ei Kagaku), 1.0 part by weight of 2-methyl-4-ethylimidazole (Shikoku Kasei), 40 parts by weight of aluminum hydroxide (Sumitomo Kagaku, particle diameter 1 micrometer or smaller), and 7.5 parts by weight of silica powder (Asahi Denka Kogyo, particle diameter 1 micrometer or smaller), in a mixed solvent of 60 parts by weight of propylene glycol monoether acetate and 7 parts by weight of ethylene glycol butyl ether acetate (EGBAc).

The prepared composition was applied to a copper foil substrate to form a film having a thickness of 70 micrometers. The coated film was dried at 120° C. for 20 minutes, and was then heated at 170° C. for 60 minutes, after which the film was allowed to cool to room temperature to form a cured resin film. Subsequently, the substrate was treated as in Example 1, and then electrolessly plated and electroplated with copper successively to form a copper film having a thickness of 25 micrometers on the resin film. The copper film had a peel strength of 950 gf/cm (9.3 N/cm).

An insulation layer formed on an aluminum sheet as in Example 1 using the above coating composition had a tensile elongation of 7.8%.

Also, a UL94V flame-retardant test as in Example 1 revealed that an insulation layer formed of the above coating composition on a halogen-free core substrate had flame-retardant properties equivalent to Class V1.

A USPCBT test performed as in Example 1 using the above composition also showed that the resistance between the adjacent wirings was maintained at the order of $1\times10^7$ ohms during the test. The resistance between adjacent wirings dried after the test was on the order of $1\times10^{12}$ ohms.

The results obtained through the tests in this example are also summarized in Table 1.

Comparative Example 1

A coating composition was prepared by dissolving or dispersing 75 parts by weight of bisphenol A epoxy resin (XAC5020 available from Ciba Geigy), 25 parts by weight of alicyclic epoxy resin having a cyclohexane skeleton (Araldite CY179 available from Ciba Geigy), 60 parts by weight of phosphate of a resorcinol type (FP-500 manufactured by Asahi Denka), 54 parts by weight of phenolic resin of an aralkyl type (XLC-LL available from Mitsui Chemical), 27 parts by weight of phenolic novolak resin (PSM-4300 available from Gun-ei Kagaku), 1.0 part by weight of 2-methyl-4-ethylimidazole (Shikoku Kasei), and 7.5 parts by weight of silica powder (Asahi Denka Kogyo, particle diameter 1 micrometer or smaller), in a mixed solvent of 60 parts by weight of propylene glycol monoether acetate and 7 parts by weight of EGBAc.

The prepared composition was applied to a copper foil substrate to form a film having a thickness of 70 micrometers. The coated film was dried at 120° C. for 20 minutes, and was then heated at 170° C. for 60 minutes, after which the film was allowed to cool to room temperature to form a cured resin film. Subsequently, the substrate was treated as in Example 1, and then electrolessly plated and electroplated with copper successively to form a copper film having a thickness of 25 micrometers on the resin film. The copper film had a peel strength of 100 gf/cm (0.98 N/cm).

An insulation layer formed on an aluminum sheet as in Example 1 using the above coating composition had a tensile elongation of 3.5%.

Also, a UL94V flame-retardant test as in Example 1 revealed that an insulation layer formed of the above composition on a halogen-free core substrate did not have sufficient flame-retardant properties ("not equivalent" in the table indicates this).

The results obtained through the tests in this example are also summarized in Table 1.

Thus, since the composition of this example used the phosphate of a resorcinol type, as a flame retardant, in the amount of two times the appropriate amount, the composition did not provide the insulation layer formed thereof with sufficient adhesion to the plated film and mechanical properties. Also, since the composition did not use aluminum hydroxide, the insulation layer had poor flame-retardant properties.

Comparative Example 2

A coating composition was prepared by dissolving or dispersing 75 parts by weight of bisphenol A epoxy resin (XAC5020 available from Ciba Geigy), 25 parts by weight of alicyclic epoxy resin having a cyclohexane skeleton (Araldite CY179 available from Ciba Geigy), 54 parts by weight of phenolic resin of an aralkyl type (XLC-LL available from Mitsui Chemical), 27 parts by weight of phenolic novolak resin (PSM-4300 available from Gun-ei Kagaku), 1.0 part by weight of 2-methyl-4-ethylimidazole (Shikoku Kasei), 7.5 parts by weight of silica powder (Asahi Denka Kogyo, particle diameter 1 micrometer or smaller), and 50 parts by weight of aluminum hydroxide (Sumitomo Kagaku, particle diameter 1 micrometer or smaller), in a mixed solvent of 60 parts by weight of propylene glycol monoether acetate and 7 parts by weight of EGBAc.

The prepared composition was applied to a copper foil substrate to form a film having a thickness of 70 micrometers. The coated film was dried at 120° C. for 20 minutes, and was then heated at 170° C. for 60 minutes, after which the film was allowed to cool to room temperature to form a cured resin film. Subsequently, the substrate was treated as in Example 1, and then electrolessly plated and electroplated with copper successively to form a copper film having a thickness of 25 micrometers on the resin film. The copper film had a peel strength of 700 gf/cm (6.9 N/cm).

An insulation layer formed on an aluminum sheet as in Example 1 using the above coating composition had a tensile elongation of 3.3%.

Also, a UL94V flame-retardant test as in Example 1 revealed that an insulation layer formed of the above composition on a halogen-free core substrate did not have sufficient flame-retardant properties.

The results obtained through the tests in this example are also summarized in Table 1.

Thus, since the composition of this example used only aluminum hydroxide and did not use a phosphate of a resorcinol type, as a flame retardant, the insulation layer formed of the composition had reduced mechanical properties and poor flame-retardant properties.

TABLE 1

| Properties | Ex. 1 | Ex. 2 | Ex. 3 | Comp. Ex. 1 | Comp. Ex. 2 |
|---|---|---|---|---|---|
| Loss-in-weight starting temperature (° C.) | 270 | 272 | 270 | — | — |
| Tg (° C.) (TMA) | 115 | 118 | 121.5 | 100 | 100 |

TABLE 1-continued

| Properties | Ex. 1 | Ex. 2 | Ex. 3 | Comp. Ex. 1 | Comp. Ex. 2 |
|---|---|---|---|---|---|
| USPCBT | good | good | good | — | — |
| Water absorption (%) | 0.9 | 0.6 | 0.7 | — | — |
| Strength at break (MPa) | 70 | 70 | 84 | 42 | 88.6 |
| Tensile elongation (%) | 5.5 | 7.2 | 7.8 | 3.5 | 3.3 |
| Peel strength (N/cm) | 9.3 | 10.8 | 9.3 | 0.98 | 6.9 |
| Flame-retarding HL94V class | V1 | V1 | V1 | Not equivalent | Not equivalent |

As described, the invention makes it possible to provide a halogen-free insulation layer which has sufficient flame-retarding properties and insulation properties in combination, is free from bleedout, and withstands a plating process, and also makes it possible to use a circuit board comprising flame-retardant insulation layers having such excellent properties.

What is claimed is:

1. A halogen-free flame-retardant insulating epoxy resin composition which comprises (1) an epoxy resin, (2) a curing agent for the epoxy resin, (3) a phosphate of a resorcinol type, (4) aluminum hydroxide, and (5) a cure accelerator for the epoxy resin; and wherein the aluminum hydroxide is contained in an amount of 15 to 20 parts by weight per 100 parts by weight of total solids in the composition.

2. The epoxy resin composition of claim 1, which comprises an alicyclic or aromatic epoxy resin.

3. The epoxy resin composition of claim 1, wherein the epoxy resin has two or more functionalities.

4. The epoxy resin composition of claim 1, wherein the epoxy resin has two to four functionalities.

5. The epoxy resin composition of claim 1, wherein two or more epoxy resins are used in combination.

6. The epoxy resin composition of claim 5, wherein a mixture of an alicyclic epoxy resin and an aromatic epoxy resin is used.

7. The epoxy resin composition of claim 1, wherein the phosphate of a resorcinol type is contained in an amount of 12 to 18 parts by weight per 100 parts by weight of total solids in the composition.

8. The epoxy resin composition of claim 1, wherein the curing agent is selected from the group consisting of phenolic resins of aralkyl types, phenolic novolak resins, and mixtures thereof.

9. The epoxy resin composition of claim 8, wherein the curing agent is used in an amount providing an active hydrogen equivalent of 0.8 to 1.1 per equivalent of epoxy group in the composition.

10. The epoxy resin composition of claim 1, wherein the cure accelerator is selected from the group consisting of imidazole compounds, triphenylphosphine, tertiary amines, and mixtures thereof.

11. The epoxy resin composition of claim 10, wherein the cure accelerator is contained in an amount of 1 to 10 parts by weight per 100 parts by weight of epoxy resin in the composition.

12. The epoxy resin composition of claim 1, which further comprises silica powder in an amount of 2.5 to 5.0 parts by weight per 100 parts by weight of total solids in the composition.

13. A circuit board which has a multi-layer structure comprising a core substrate and one or more sets of alternate insulation layer and wiring layer on the core substrate, and wherein at least one of the insulation layers is formed of the halogen-free, flame-retardant insulating epoxy resin composition which comprises (1) an epoxy resin, (2) a curing agent for the epoxy resin, (3) a phosphate of a resorcinol type, (4) aluminum hydroxide, and (5) a cure accelerator for the epoxy resin.

14. The circuit board of claim 13, wherein the epoxy resin composition comprises an alicyclic or aromatic epoxy resin.

15. The circuit board of claim 13, wherein the epoxy resin has two or more functionalities.

16. The circuit board of claim 13, wherein the epoxy resin has two to four functionalities.

17. The circuit board of claim 13, wherein two or more epoxy resins are used in combination.

18. The circuit board of claim 17, wherein a mixture of an alicyclic epoxy resin and an aromatic epoxy resin is used.

19. The circuit board of claim 18, wherein the mixture contains at least one epoxy resin having three or more functionalities.

20. The circuit board of claim 17, wherein the epoxy resin composition comprises at least a trifunctional epoxy resin, in addition to at least a difunctional alicyclic epoxy resin and a difunctional aromatic epoxy resin.

21. The circuit board of claim 13, wherein the phosphate of a resorcinol type is contained in an amount of 12 to 18 parts by weight per 100 parts by weight of total solids in the epoxy resin composition.

22. The circuit board of claim 13, wherein the aluminum hydroxide is contained in an amount of 15 to 20 parts by weight per 100 parts by weight of total solids in the epoxy resin composition.

23. The circuit board of claim 13, wherein the curing agent is selected from the group consisting of phenolic resins of aralkyl types, phenolic novolak resins, and mixtures thereof.

24. The circuit board of claim 23, wherein the curing agent is used in an amount providing an active hydrogen equivalent of 0.8 to 1.1 per equivalent of epoxy group in the epoxy resin composition.

25. The circuit board of claim 13, wherein the cure accelerator is selected from the group consisting of imidazole compounds, triphenylphosphine, tertiary amines, and mixtures thereof.

26. The circuit board of claim 25, wherein the cure accelerator is contained in an amount of 1 to 10 parts by weight per 100 parts by weight of epoxy resin in the composition.

27. The circuit board of claim 13, wherein the epoxy resin composition further comprises silica powder in an amount of 2.5 to 5.0 parts by weight per 100 parts by weight of total solids in the composition.

28. A halogen-free, flame-retardant insulating epoxy resin composition which comprises an epoxy resin, a curing agent for the epoxy resin, a phosphate of a resorcinol type, aluminum hydroxide, and a cure accelerator for the epoxy resin;

wherein two or more epoxy resins are used in combination; and which comprises at least a trifunctional epoxy resin in addition to at least a difunctional alicyclic epoxy resin and a difunctional aromatic epoxy resin.

29. A halogen-free, flame-retardant insulating epoxy resin composition which comprises (1) an epoxy rise, (2) a curing agent for the epoxy resin, (3) a phosphate of a resorcinol type, (4) aluminum hydroxide, and (5) a cure accelerator for the epoxy resin; and which further comprises silica powder in an amount of 2.5 to 5.0 parts by weight per 100 parts by weight of total solids in the composition.

* * * * *